(12) United States Patent
Manninen et al.

(10) Patent No.: US 11,297,727 B2
(45) Date of Patent: Apr. 5, 2022

(54) POWER ELECTRONIC MODULE

(71) Applicant: ABB Schweiz AG, Baden (CH)

(72) Inventors: Jorma Manninen, Vantaa (FI); Mika Silvennoinen, Espoo (FI); Joni Pakarinen, Vantaa (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/598,131

(22) Filed: Oct. 10, 2019

(65) Prior Publication Data

US 2020/0120825 A1 Apr. 16, 2020

(30) Foreign Application Priority Data

Oct. 11, 2018 (EP) ..................................... 18199846

(51) Int. Cl.
| | | |
|---|---|---|
| *H01L 23/00* | (2006.01) | |
| *H05K 7/14* | (2006.01) | |
| *H05K 7/20* | (2006.01) | |
| *H01L 23/373* | (2006.01) | |
| *H01L 23/31* | (2006.01) | |

(52) U.S. Cl.
CPC ....... *H05K 7/1432* (2013.01); *H01L 23/3121* (2013.01); *H01L 23/3733* (2013.01); *H05K 7/2039* (2013.01)

(58) Field of Classification Search
None
See application file for complete search history.

(56) References Cited

U.S. PATENT DOCUMENTS

| | | | |
|---|---|---|---|
| 2005/0199999 A1* | 9/2005 | Shirasawa | ............... H01L 23/34 257/706 |
| 2013/0134572 A1 | 5/2013 | Lenniger et al. | |
| 2014/0133105 A1 | 5/2014 | Yee et al. | |
| 2017/0341638 A1 | 11/2017 | Sawada | |
| 2020/0020608 A1* | 1/2020 | Haraguchi | .......... H01L 23/4006 |

FOREIGN PATENT DOCUMENTS

| | | |
|---|---|---|
| DE | 102013018599 A1 | 5/2014 |
| WO | 2018180356 A1 | 10/2018 |

OTHER PUBLICATIONS

European Patent Office, Extended Search Report issued in corresponding Application No. 18199846.9, dated Mar. 26, 2019, 8 pp.

\* cited by examiner

*Primary Examiner* — Reema Patel
(74) *Attorney, Agent, or Firm* — Leydig, Voit & Mayer, Ltd.

(57) ABSTRACT

A power electronic component including a surface adapted to be attached to a heatsink, the surface forming a bottom surface of the power electronic component, one or more power electronic semiconductor chips mounted on a substrate above the bottom surface, and a housing enclosing the one or more power electronic semiconductor chips. The power electronic component includes a thermal insulator disposed above the one or more power electronic semiconductor chips, such that the bottom surface and the thermal insulator are on the opposite sides of the one or more power electronic semiconductor chips.

1 Claim, 3 Drawing Sheets

POWER ELECTRONIC MODULE

FIELD OF THE INVENTION

The present invention relates to power electronics, and specifically to power electronic component or power electronic modules.

BACKGROUND OF THE INVENTION

Power electronic components and power electronic modules produce heat when they are operated. Typical power electronic components include diodes, transistors, IGBTs and thyristors. Typical power electronic modules comprise multiple of power electronic components which are wired together internally and function as a building blocks for certain electrical devices. A power electronic module may be, for example, internally wired to form an inverter bridge.

The heat in power electronic components and power electronics modules is generated mainly during the switching instants of the components when the components are turned on or off. The amount of dissipated power can be up to hundreds of Watts and even over thousand watts.

The losses that generate heat are formed in diode and transistor semiconductor chips which have an area of few square centimetres. The loss density can thus be over 100 Watts per square centimetre and the temperature of the chips may rise up to 175 degrees Celsius during use.

The power electronic modules are structured such that the dissipated heat is transferred through a base plate of the module to an external heatsink which is attached firmly to the base plate. Power electronic modules may also be structured without a baseplate in which case the bottom of the mode is attached to a heat sink. Whether the power electronic module has a base plate or not, a heatsink is used and the power electronic module has a surface which is intended to be attached against a heatsink. The transfer of heat of a power electronic module to a heatsink is increased with a thermal interface material layer which is placed between the surface of the power electronic module and the heat sink.

The heat transfer path from the semiconductor chip to the bottom surface of the power electronic module is designed to be effective such that as much heat is transferred through this path to the heat sink. Although most of the heat is transferred to the bottom of the module, a certain part of the dissipated heat is transferred elsewhere in the module. This heat transfers trough structural elements, such as plastic construction parts and electrically controlling pins to other parts of the structure of the module. The heat is transferred also to the housing of the power electronic module and further from the housing to a control board which is used for providing required control voltages to the components of the module. When the temperature of the control board increases, the reliability of the control board weakens. The increased temperature may lead to shortened lifetime of the control board and to malfunctions in the control board. Further, the components of the driver card may have to be selected to withstand higher temperatures which increases the costs of the driver card.

BRIEF DESCRIPTION OF THE INVENTION

An object of the present invention is to provide a power electronic component to solve the above problem. The object of the invention is achieved by a power electronic component which is characterized by what is stated in the independent claim. The preferred embodiments of the invention are disclosed in the dependent claims.

The invention is based on the idea of providing thermally insulating material to a power electronic component such that the heat transfer outside the component is limited from the areas in which the heat could damage or harm other electric components.

An advantage of the power electronic component of the invention is that the generated heat of the power semiconductor component is not able to warm excessively other electronic components or circuits which are placed in close vicinity of the power electronic component. Further, the power electronic component of the invention is advantageous in high IP-class devices in which the heat inside an enclosure of the device is problematic. This advantageous feature is based on the fact that with the component of the present invention heat is transferred more effectively to the bottom surface of the component from which the heat can be transferred outside the enclosure.

Further, the invention allows increasing the integration degree of the power electronic semiconductor chips when the heat transfer from the bottom surface of the power semiconductor component is increased.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
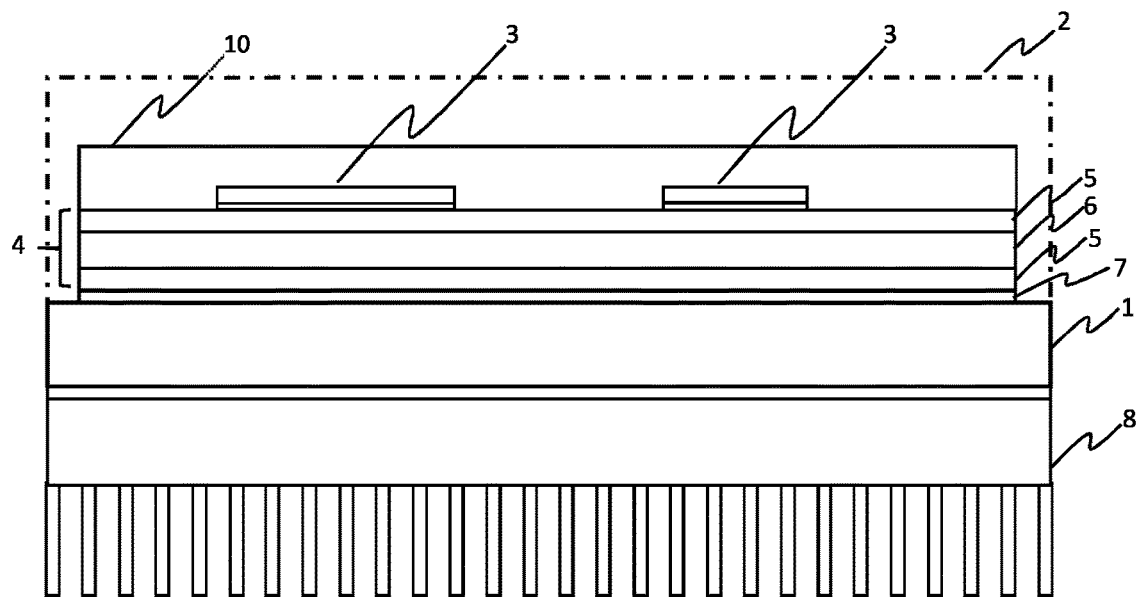
FIG. 1 is shows an example of a cross section of a known power electronic module.

FIG. 1 shows a cross section of a known power electronic component and more specifically a power electronic component having multiple of power electronic semiconductor chips. Such a component is typically referred to as a power electronic module. In the following description, the power electronic component is described in connection with a power electronic module. However, it is clear that the power electronic component of the invention may comprise only one power electronic semiconductor chip.

In FIG. 1 the power electronic module is shown to be attached to a heat sink 8. The attachment to the heatsink is through the base plate 1 of the module. The base plate 1 forms the bottom surface of the module and is intended to be attached against a cooling element, such as a heatsink. A substrate 4 is soldered with a base solder layer 7 to the base plate. The substrate is formed in the example as a direct bonded copper (DBC) substrate and it consists of two copper layers 5 and a ceramic layer 6 between the copper layers. On top of the substrate are the one or more power electronic semiconductor chips 3 which are soldered to the substrate. FIG. 1 shows further a gel layer 10 on top of the semiconductor chips 3 and the substrate 4. The gel layer is applied to protect the chips 3 from the possible pollutants present in the surrounding atmosphere. FIG. 1 shows the cross section of the gel layer as rectangle for illustrative purposes. However, the gel layer is soft and deformable.

Figure 2:
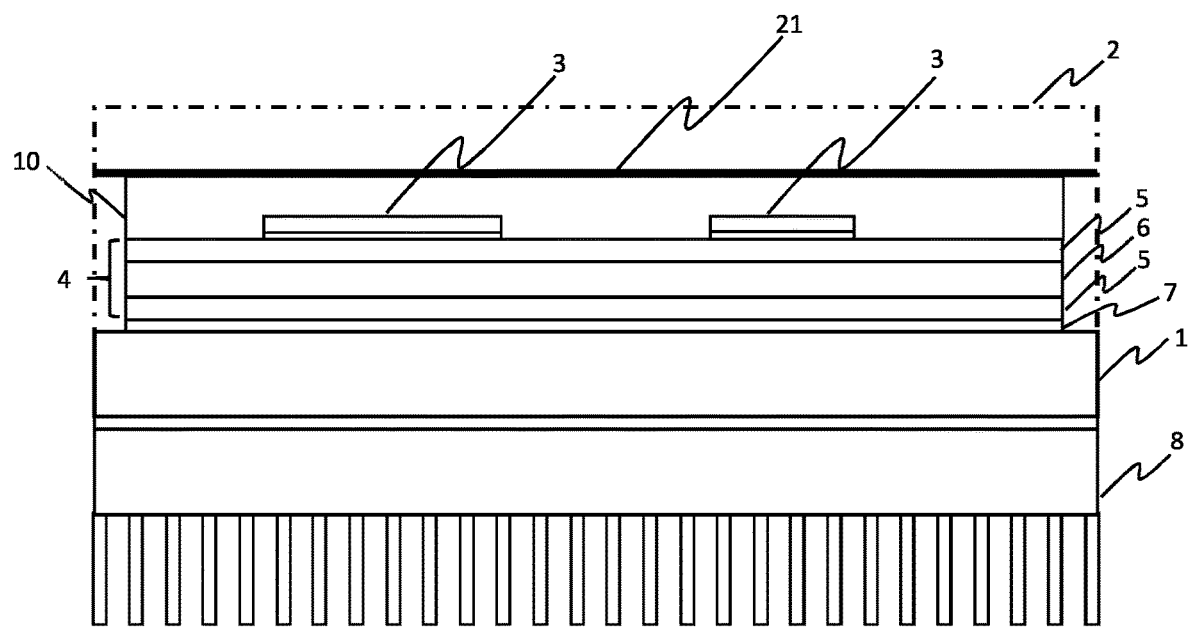
FIGS. 2, 3, 4 and 5 show cross sections of different embodiments of the invention.

FIG. 2 shows an embodiment of a power electronic component of the present invention. In the embodiment, the power electronic component comprises a surface adapted to be attached to a heatsink. In the embodiment the surface is the surface of a baseplate 1 of the power electronic component which thus forms the bottom surface of the power electronic component.

The power electronic component further comprises one or more power electronic semiconductor chips 3 mounted on a substrate 4 above the bottom surface. The cross section of FIG. 2 shows two semiconductor chips 3 and the power electronic component is thus a power electronic module. A housing 2 encloses the one or more power electronic semiconductor chips.

According to the invention, the power electronic component comprises a thermal insulator 21 disposed above the one or more power electronic semiconductor chips. The thermal insulator is above the one or more power electronic semiconductor chips as the bottom surface of the power electronic component and the thermal insulator are on the opposite sides of the one or more power electronic semiconductor chips and on the opposite sides of the substrate 4.

As shown in FIG. 2, the thermal insulator 21 is adapted to increase the thermal resistance from the semiconductor chips 3 towards the top of the module. The top of the module is defined as the surface of the housing that forms the outer surface of the module.

In the embodiment of FIG. 2, the power electronic component comprises a layer of silicone gel 10 on top of the one or more power electronic semiconductor chips and the thermal insulator is arranged above the layer of silicone gel inside the housing 2. The term above should be understood such that the base plate is in the bottom, and the direction "up" refers to the direction from the base plate towards the housing of the power electronic component. The thermal insulator blocks effectively the heat transfer from the chips towards the top of the housing.

Figure 3:
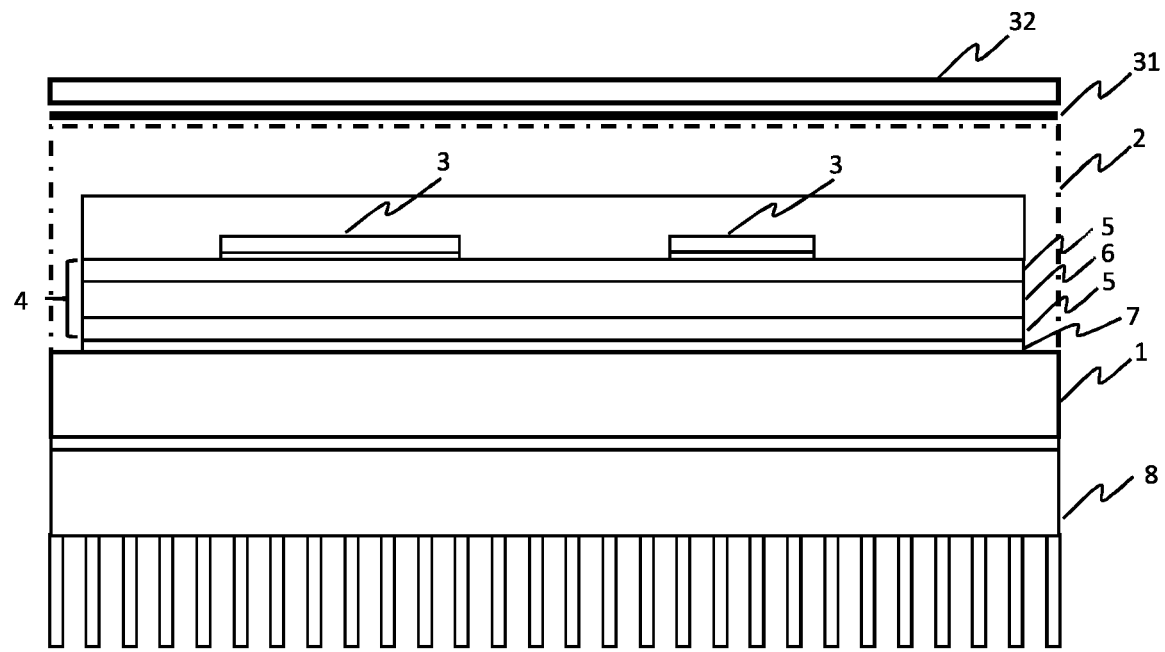

According to an embodiment of the invention shown in FIG. 3, the thermal insulator 31 is arranged on top of the housing of the semiconductor component. The thermal insulator 31 blocks the heat from the power semiconductor component such that a board 32 with electrical components is not heated excessively. FIG. 3 shows a control board 32 or similar board with electrical circuits attached on the top of the housing 2. It is often desirable to have electronic circuits close to the power electronic component when the electronic circuit is used for controlling the one or more switches of the power electronic component. In FIG. 3 the other structural parts correspond to those of FIG. 2 and the numbering of the parts correspond to FIG. 2.

According to an embodiment, the thermal insulator is in a form of a fabric. The fabric comprises silicon oxide particles which are effective insulators. When the insulator is in form of a fabric, it can be cut to shape and installed in desired locations. The silicon oxide particles are preferably micro or nano sized and porous particles. An example of a suitable silicon oxide is aerogel which is known to have good thermal properties and electrical resistivity. Silicon oxide can be arranged in a fabric and thus such a fabric has a low thermal conductivity and high electrical resistance.

Figure 4:
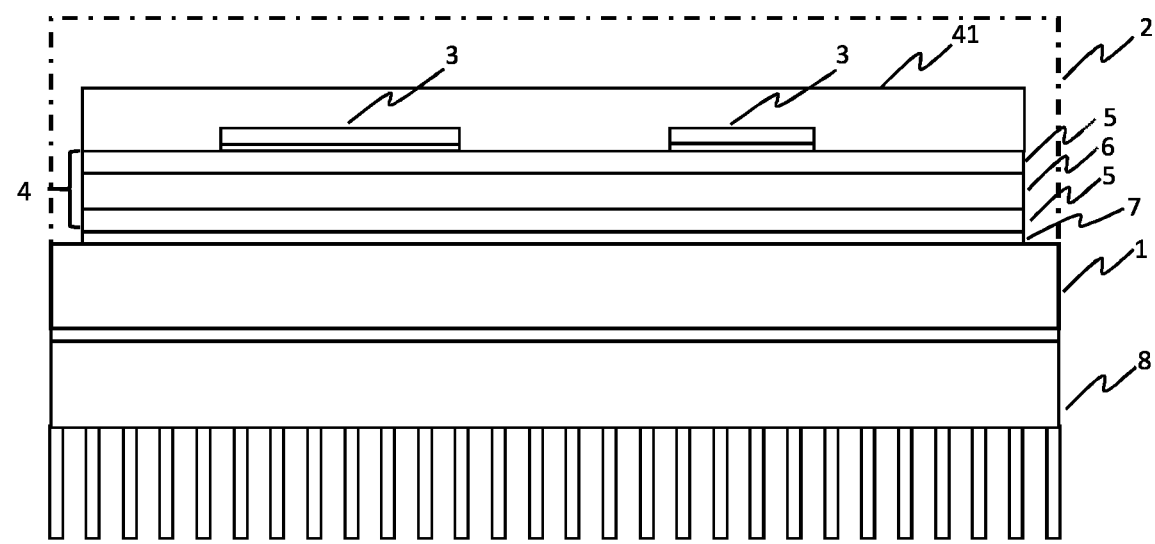

FIG. 4 shows another embodiment of the present invention. In the embodiment, the thermal insulator is in a form of a gel 41 which is applied on top of the one or more power electronic semiconductor chips 3. As seen in FIG. 4, the gel 41 is shown as covering the top surface of the substrate 4 and the semiconductor chips 3. The gel is formed with a suitable matrix material, such as silicon and comprises silicon oxide particles which form the insulating material. As in connection with the embodiment of FIG. 3, the silicon oxide is in the form micro or nano sized porous particles. In one embodiment aerogel is used in silicon matrix to obtain the gel like material that can be disposed to cover the semiconductor chips and the top surface of the substrate. When a gel like thermal insulator is used, it replaces the separate silicone gel shown in embodiments of FIGS. 2 and 3, as the gel like thermal insulator protects the semiconductor chips from moist and surrounding atmosphere.

Figure 5:
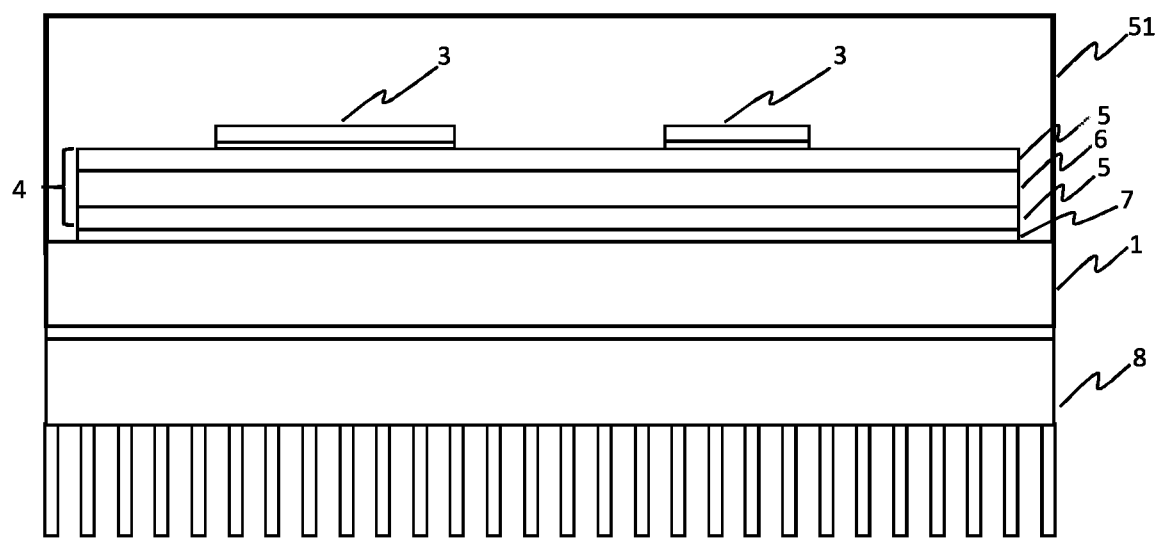

FIG. 5 shows another embodiment of the invention, in which the housing 51 of the power electronic component comprises plastic material with silicon oxide particles and the housing forms the thermal insulator. Silicon oxide particles can be doped in polymers such that a plastic composite is formed which is efficient both as thermal and electrical insulator. The plastic composite can be die casted and the housing can be formed by die casting. One suitable type of silicon oxide usable in the plastic material is aerogel. To avoid repetition, corresponding structural parts of FIG. 5 are numbered as in the previous Figures.

In the above the invention is described in connection with a power electronic component which includes multiple of power electronic switches and chips, i.e. power electronic modules. The same structure is also present in components which have only one switch.

Further, in each of the examples presented above the bottom surface of the power electronic component is formed of a base plate which is internally connected to the substrate. That is, in the examples the base plate is part of the components. The invention is applicable also to power electronic components in which the bottom surface is formed of the surface of the substrate, i.e. components which do not have a base plate. When the component does not have a base plate, the heat is conducted from the substrate directly to a heatsink.

It will be obvious to a person skilled in the art that the inventive concept can be implemented in various ways. The invention and its embodiments are not limited to the examples described above but may vary within the scope of the claims.

The invention claimed is:

1. A power electronic component comprising:
    a surface adapted to be attached to a heatsink, the surface forming a bottom surface of the power electronic component;
    one or more power electronic semiconductor chips mounted on a substrate above the bottom surface;
    a housing enclosing the one or more power electronic semiconductor chips;
    a layer of silicone gel on top of the one or more semiconductor chips; and
    a thermal insulator disposed above the one or more power electronic semiconductor chips, above the layer of silicone gel, and entirely inside the housing, such that the bottom surface and the thermal insulator are on the opposite sides of the one or more power electronic semiconductor chips,
    wherein the thermal insulator is in a form of a fabric, comprising silicon oxide particles.

* * * * *